United States Patent

Wu

[11] Patent Number: 5,866,455
[45] Date of Patent: Feb. 2, 1999

[54] METHOD FOR FORMING A DRAM CELL WITH A MULTIPLE PILLAR-SHAPED CAPACITOR

[75] Inventor: Shye-Lin Wu, Hsinchu, Taiwan

[73] Assignee: Texas Instruments - Acer Incorporated, Hsinchu, Taiwan

[21] Appl. No.: 954,413

[22] Filed: Oct. 20, 1997

[51] Int. Cl.$^6$ ................................. H01L 21/8242
[52] U.S. Cl. ............................ 438/255; 438/398
[58] Field of Search ..................... 438/238, 239, 438/253–256, 381, 396–399

[56] References Cited

U.S. PATENT DOCUMENTS 5,726,085  3/1998  Crenshaw et al. ............... 438/255
5,754,390  5/1998  Sandu et al. ................... 361/321.4

Primary Examiner—Joni Chang
Attorney, Agent, or Firm—Merchant, Gould, Smith, Edell, Welter & Schmidt

[57] ABSTRACT

A method for forming a multiple pillar-shaped capacitor of a dynamic random access memory cell is disclosed. The method includes patterning to form a doped polysilicon layer (118) over a semiconductor substrate (110), wherein at least a portion of the doped polysilicon layer communicates to the substrate. Next, a titanium nitride layer (122) is conformably formed on the doped polysiliocn layer, and a hemispherical grained silicon layer (124) is then formed on the titanium nitride layer, wherein the titanium nitride layer serves as a seed layer for forming the hemispherical grained silicon layer. The present invention also includes etching the titanium nitride layer using the hemispherical grained silicon layer as a mask, and etching portions of the doped polysilicon layer using the titanium nitride layer as an etch mask. Finally, a dielectric layer (136) is formed on the doped polysilicon layer, and a conductive layer (138) is then formed on the dielectric layer.

14 Claims, 4 Drawing Sheets

METHOD FOR FORMING A DRAM CELL WITH A MULTIPLE PILLAR-SHAPED CAPACITOR

BACKGROUND OF THE INVENTION

1. Field of the Invention

The present invention relates to dynamic random access memory (DRAM) fabrication, and more particularly, to a method for forming a multiple pillar-shaped capacitor of a dynamic random access memory cell.

2. Description of the Prior Art

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

SUMMARY OF THE INVENTION

In accordance with the present invention, a method is provided for forming a multiple pillar-shaped capacitor of a dynamic random access memory cell that substantially increases the surface of the capacitor. In one embodiment, a first dielectric layer is firstly formed on a semiconductor substrate, followed by forming a silicon oxide layer on the first dielectric layer. Next, the first dielectric layer and the silicon oxide layer are patterned to form a contact hole in the first dielectric layer and the silicon oxide layer, therefore exposing a portion of the substrate. Thereafter, a doped polysilicon layer is patterned to form on the silicon oxide layer, and a titanium nitride layer is conformably formed on the doped polysiliocn layer. After forming a hemispherical grained silicon layer on the titanium nitride layer, the titanium nitride layer is etched using the hemispherical grained silicon layer as a mask. Further, the hemispherical grained silicon layer is removed, and portions of the doped polysilicon layer are etched using the titanium nitride layer as an etch mask. Finally, a second dielectric layer is formed on the doped polysilicon layer, and a conductive layer is formed on the second dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
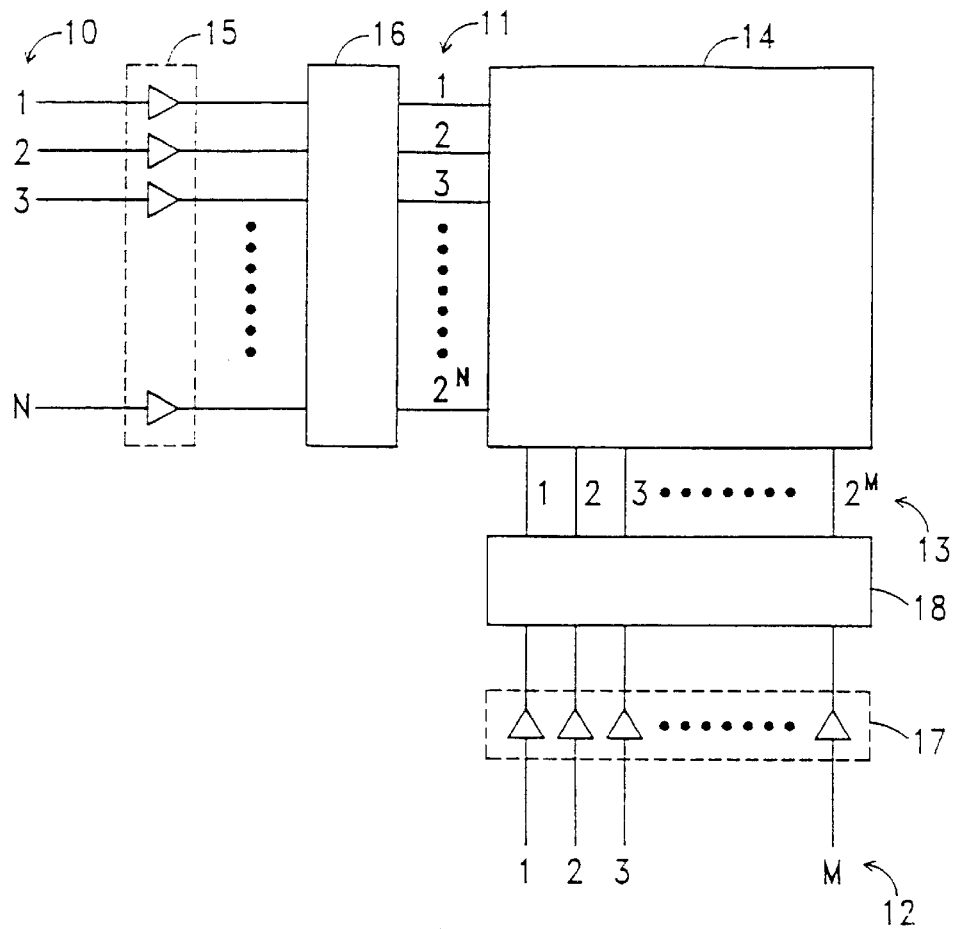
FIG. 1 shows a simplified diagram illustrative of the organization of a typical large semiconductor memory.
Figure 2A:
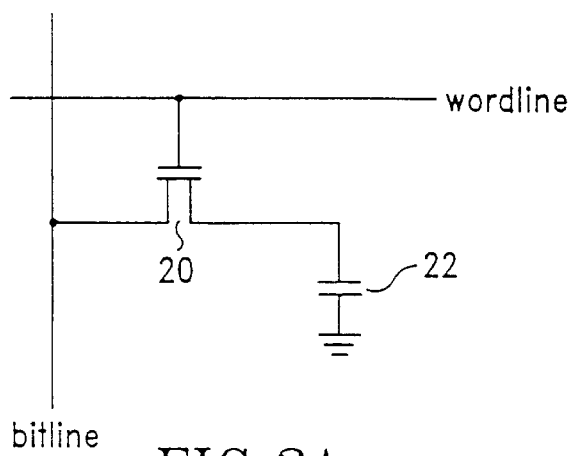
FIG. 2A shows a circuit schematic diagram of a typical one-transistor dynamic random access memory (DRAM) cell.
Figure 2B:
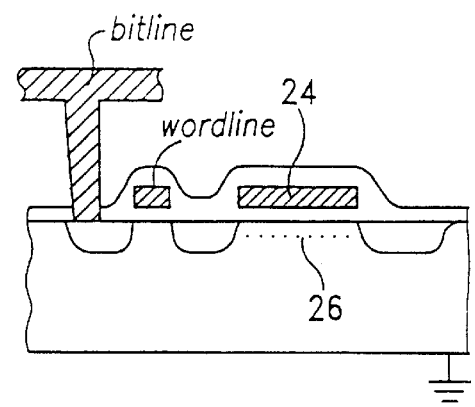
FIG. 2B shows a cross-sectional view illustrative of traditional one-transistor DRAM storage cell.
Figure 3:
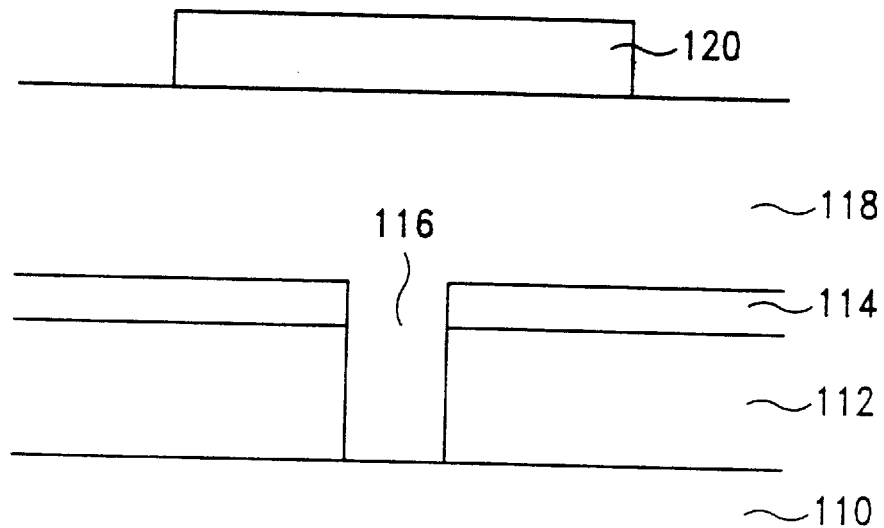
FIGS. 3–8 show cross-sectional views illustrative of various stages in the fabrication of a DRAM capacitor in accordance with the present invention.

FIG. 3 shows a cross-sectional view illustrative of a portion of a dynamic random access memory (DRAM) cell in accordance with one embodiment of the present invention, wherein a dielectric layer 112, such as tetraethylorthosilicate (TEOS) or boro-phosphosilicate glass (BPSG), is deposited on a semiconductor substrate 110. A silicon oxide layer 114 is then deposited on the dielectric layer 112. In this embodiment, this silicon oxide layer 114 is deposited using a conventional low pressure chemical vapor deposition (LPCVD) or plasma enhanced chemical vapor deposition (PECVD) process. The thickness of this silicon oxide layer 114 can range from about 1000 to 10000 angstroms. It is noted that a contact hole 116 is formed in the silicon oxide layer 114 and the dielectric layer 112 so that a portion of the substrate 110, such as a source region, is exposed.

Figure 4:
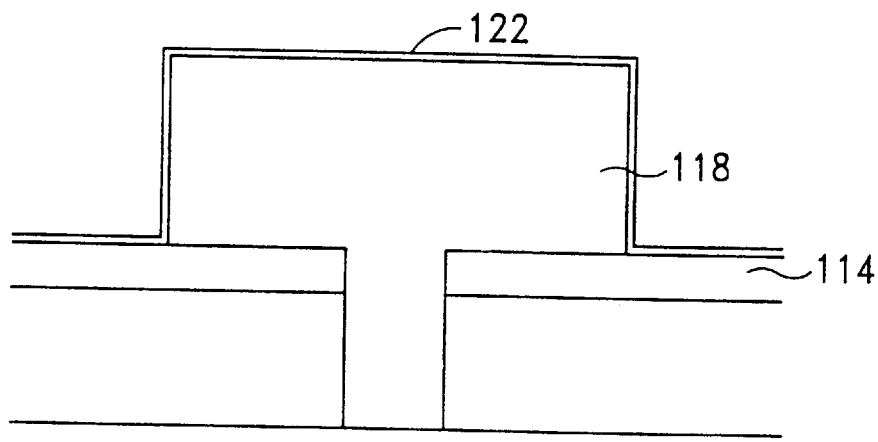

A doped polysilicon layer 118 is then formed on the silicon oxide layer 114, therefore filling the contact hole 116. In this embodiment, the polysilicon layer 118 is deposited using a standard chemical vapor deposition process to a thickness of about 3000–6000 angstroms above the surface of the silicon oxide layer 114. A photoresist layer 120 is then formed and patterned on the doped polysilicon layer 118 using conventional photolithographic techniques, defining a storage node region in the polysilicon layer 118 as shown in FIG. 4.

Next, a thin titanium nitride (TiN) layer 122 is conformably formed on the doped polysilicon layer 118 and the silicon oxide layer 114 using a suitable process. In this embodiment, a low pressure chemical vapor deposition (LPCVD) is preferably used to achieve excellent conformity and thickness controllability. The TiN layer 122 is preferably deposited to a thickness between about 100 to 300 angstroms, which can range from about 50 to 1000 angstroms. This TiN layer 122 will serve as a seed layer, which will become apparent when the following steps are explained.

Figure 5:
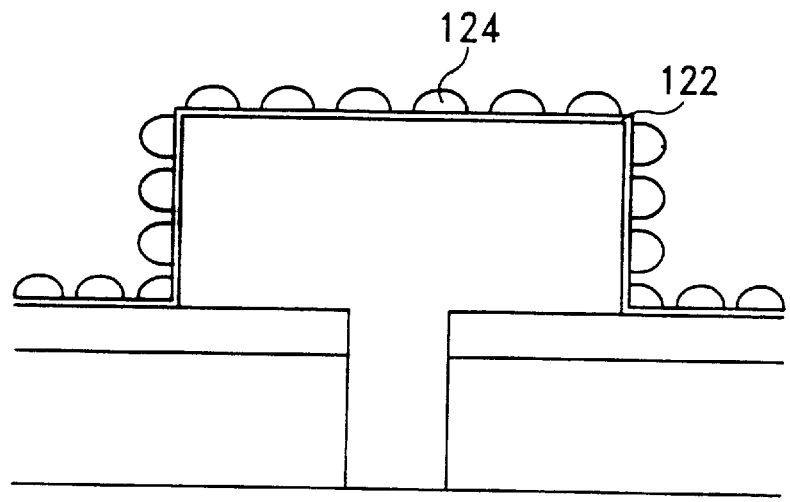

Referring to FIG. 5, a hemispherical grained (HSG) silicon layer 124 is then deposited on the TiN layer 122, wherein the TiN layer 122 is used as a seed layer. In this invention, the nucleation sites in forming the HSG silicon layer 124 are provided by the TiN layer 122, rather than silicon oxide or other particles as in the conventional technique for forming HSG layer. During forming the HSG silicon layer 124 in accordance with the embodiment of the present invention, deposited HSG polysilicon nucleates on the TiN surface, or in the gas phase, to form a great number of polysiliocn nodules over the TiN layer 122. While the polysiliocn deposition is continued further, these nodules grow to become grains as shown in FIG. 5. It is noted that a low temperature of about 300° C. is sufficient to form the HSG silicon layer 124, for example, using plasma enhanced chemical vapor deposition (PECVD) in the preferred embodiment, compared to a required high temperature of about 560–590° C. in forming HSG silicon using the conventional technique, such as low pressure chemical vapor deposition (LPCVD).

Figure 6:
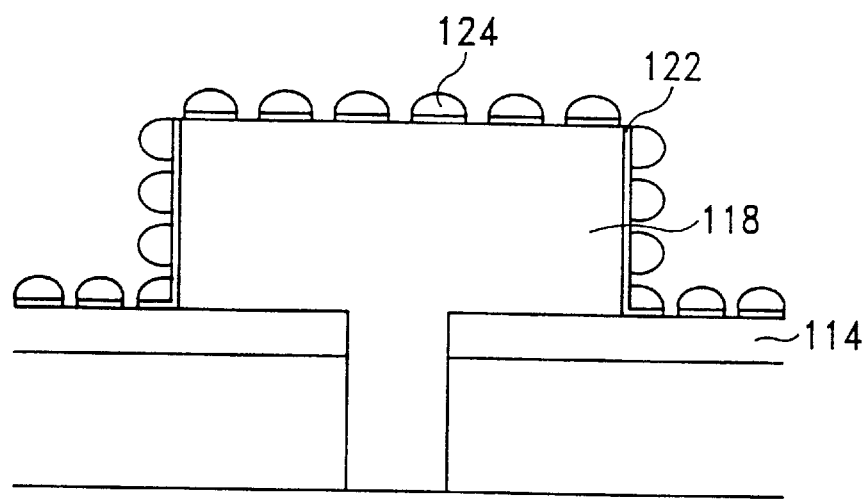
Figure 7:
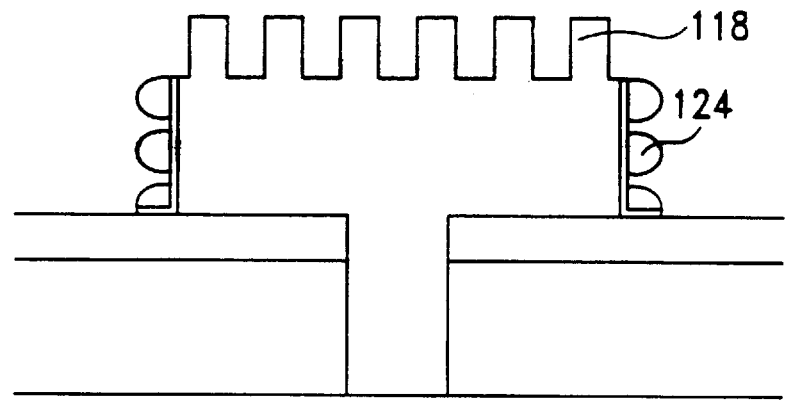

The TiN layer 122 is then etched back using the HSG layer 124 as a mask to expose the doped polysilicon layer 118 as shown in FIG. 6. Thereafter, the residual TiN layer 122 is used as an etch mask to remove the grains of HSG silicon layer 124 primarily resided on the top surface of the doped polysilicon layer 118 and the surface of the silicon oxide layer 114. Further, portions of the doped polysilicon layer 118 are etched back, followed by removing the residual TiN layer 122, forming the structure as shown in FIG. 7.

Figure 8:
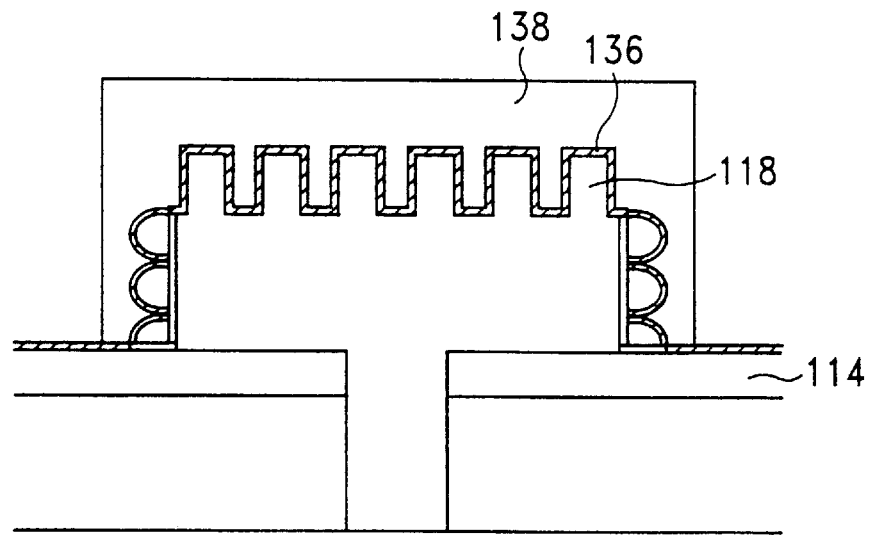

Referring to FIG. 8, a dielectric film 136 and a top electrode 138 of the DRAM cell capacitor can then be formed in the conventional manner. In this embodiment, a thin dielectric layer 136, such as stacked oxide-nitride-oxide (ONO) film, is formed on the exposed surface of the bottom electrode (i.e., the storage node 118) and the surface of the silicon oxide layer 114. As is known in the art of DRAM fabrication, the ONO film is reliable over shaped silicon surfaces, and is typically used as a capacitor insulator. The bottom oxide layer of the stacked oxide-nitride-oxide (ONO) film 136 is conventionally formed by thermally oxidizing the silicon surface, depositing an LPCVD silicon nitride layer and then oxidizing the silicon nitride layer to form the top oxide layer. Other material, such as NO, $Ta_2O_5$, $TiO_2$, PZT, or BST can be used as the thin dielectric layer 136. A conductive layer 138 is then deposited over the stack oxide/silicon nitride/oxide layer 136 to serve as an upper plate of the DRAM cell capacitor. Typically, the conductive layer 138 is a doped polysilicon layer formed in the same manner as the polysilicon layer 118.

Although specific embodiments have been illustrated and described, it will be obvious to those skilled in the art that various modifications may be made without departing from the spirit which is intended to be limited solely by the appended claims.

What is claimed is:

1. A method for forming a capacitor of a dynamic random access memory cell, said method comprising:

patterning to form a doped polysilicon layer over a semiconductor substrate, at least a portion of said doped polysilicon layer communicating to said substrate;

conformably forming a titanium nitride layer on said doped polysilicon layer;

forming a hemispherical grained silicon layer on said titanium nitride layer, said titanium nitride layer serving as a seed layer for forming said hemispherical grained silicon layer;

etching said titanium nitride layer using said hemispherical grained silicon layer as a mask;

etching portions of said doped polysilicon layer using said titanium nitride layer as an etch mask;

forming a dielectric layer on said doped polysilicon layer; and forming a conductive layer on said dielectric layer.

2. The method according to claim 1, before forming said doped polysilicon layer, further comprising forming a stack of a first silicon oxide layer and a second silicon oxide layer on said substrate.

3. The method according to claim 2, wherein said stack of the first silicon oxide layer and the second silicon oxide layer has a contact hole formed therein so that said at least a portion of the doped polysilicon layer is communicated to said substrate via the contact hole.

4. The method according to claim 3, wherein said first silicon oxide layer comprises tetraethylorthosilicate (TEOS).

5. The method according to claim 3, wherein said first silicon oxide layer comprises boro-phosphosilicate glass (BPSG).

6. The method according to claim 1, wherein said titanium nitride layer is formed using low pressure chemical vapor deposition process.

7. The method according to claim 1, wherein said hemispherical grained silicon layer is formed using plasma enhanced chemical vapor deposition (PECVD) process.

8. The method according to claim 7, wherein said hemispherical grained silicon layer is formed at a temperature of about 300° C.

9. A method for forming a capacitor of a dynamic random access memory cell, said method comprising:

forming a first dielectric layer on a semiconductor substrate;

forming a silicon oxide layer on said first dielectric layer;

patterning said first dielectric layer and said silicon oxide layer to form a contact hole in said first dielectric layer and said silicon oxide layer, therefore exposing a portion of the substrate;

patterning to form a doped polysilicon layer on said silicon oxide layer;

conformably forming a titanium nitride layer on said doped polysiliocn layer;

forming a hemispherical grained silicon layer on said titanium nitride layer, said titanium nitride layer serving as a seed layer for forming said hemispherical grained silicon layer;

etching said titanium nitride layer using said hemispherical grained silicon layer as a mask;

removing said hemispherical grained silicon layer;

etching portions of said doped polysilicon layer using said titanium nitride layer as an etch mask;

forming a second dielectric layer on said doped polysilicon layer; and forming a conductive layer on said second dielectric layer.

10. The method according to claim 9, wherein said first dielectric layer comprises tetraethylorthosilicate (TEOS).

11. The method according to claim 9, wherein said first dielectric layer comprises boro-phosphosilicate glass (BPSG).

12. The method according to claim 9, wherein said titanium nitride layer is formed using low pressure chemical vapor deposition process.

13. The method according to claim 9, wherein said hemispherical grained silicon layer is formed using plasma enhanced chemical vapor deposition (PECVD) process.

14. The method according to claim 13, wherein said hemispherical grained silicon layer is formed at a temperature of about 300° C.

* * * * *